United States Patent
Abbott et al.

(10) Patent No.: US 6,861,927 B1
(45) Date of Patent: Mar. 1, 2005

(54) LONGITUDINALLY COUPLED LEAKY SURFACE ACOUSTIC WAVE RESONATOR FILTER

(75) Inventors: Benjamin P. Abbott, Orlando, FL (US); Joshua J. Caron, Altamonte Springs, FL (US); Kamran S. Cheema, Apopka, FL (US)

(73) Assignee: Sawtek, Inc., Orlando, FL (US)

( * ) Notice: Subject to any disclaimer, the term of this patent is extended or adjusted under 35 U.S.C. 154(b) by 0 days.

(21) Appl. No.: 10/132,076

(22) Filed: Apr. 25, 2002

Related U.S. Application Data

(60) Provisional application No. 60/286,901, filed on Apr. 27, 2001, and provisional application No. 60/286,877, filed on Apr. 27, 2001.

(51) Int. Cl.$^7$ .............................................. H03H 9/64
(52) U.S. Cl. .................... 333/195; 333/193; 310/313 R; 310/313 B
(58) Field of Search ............................... 333/193, 195; 310/313 R, 313 A, 313 B, 313 D

(56) References Cited

U.S. PATENT DOCUMENTS

| | | | |
|---|---|---|---|
| 5,499,003 A | | 3/1996 | Davenport |
| 5,610,566 A | | 3/1997 | Chen et al. |
| 5,796,205 A | * | 8/1998 | Nishihara et al. ....... 310/313 R |
| 5,932,950 A | * | 8/1999 | Yamada et al. ......... 310/313 D |
| 5,936,483 A | | 8/1999 | Ikada |
| 5,936,487 A | | 8/1999 | Solal et al. |
| 5,990,762 A | * | 11/1999 | Nakamura et al. .......... 333/195 |
| 6,104,260 A | * | 8/2000 | Yamada et al. ............. 333/193 |
| 6,208,224 B1 | | 3/2001 | Taniguchi et al. |
| 6,268,782 B1 | * | 7/2001 | Hartmann et al. .......... 333/193 |
| 6,317,015 B1 | * | 11/2001 | Ueda et al. ................. 333/193 |
| 6,380,827 B1 | | 4/2002 | Noguchi |
| 6,501,208 B1 | * | 12/2002 | Kuroda .................... 310/313 R |
| 6,781,478 B2 | * | 8/2004 | Takamine et al. ........... 333/133 |
| 6,798,318 B1 | * | 9/2004 | Abbott et al. ............... 333/195 |
| 2002/0000898 A1 | | 1/2002 | Takamine |

FOREIGN PATENT DOCUMENTS

| | | |
|---|---|---|
| DE | 42 12517 | 2/1995 |
| DE | 4212517 | 2/1995 |

* cited by examiner

*Primary Examiner*—Timothy P. Callahan
*Assistant Examiner*—An T. Luu
(74) *Attorney, Agent, or Firm*—Allen, Dyer, Doppelt, Milbrath & Gilchrist, P.A.

(57) ABSTRACT

A longitudinally coupled leaky surface acoustic wave (LSAW) resonator filter has a wide bandwidth, low insertion loss and return loss characteristics, and high power handling capability. The LSAW resonator filter includes a plurality of longitudinally coupled LSAW resonator tracks disposed upon a piezoelectric substrate and connected in series. The resonator tracks each include reflective gratings and interdigital transducers (IDTs) disposed end-to-end. Acoustic resonant cavities are formed between each IDT and its neighboring IDTs or gratings by chirping the fingers of the IDT in the vicinity of the cavities. Phase discontinuity is eliminated; reflective bulk acoustic wave scattering is reduced; and improved insertion loss and power handling capability are achieved.

19 Claims, 6 Drawing Sheets

LONGITUDINALLY COUPLED LEAKY SURFACE ACOUSTIC WAVE RESONATOR FILTER

CROSS REFERENCE TO RELATED APPLICATIONS

This application incorporates by reference and claims priority to Provisional Application Ser. No. 60/286,901 for "Longitudinally Coupled Leaky surface Acoustic Wave resonator Filter" having a filing date of Apr. 27, 2001, and incorporates the disclosure of Provisional Application Ser. No. 60/286,877 for "Hybrid Leaky Surface Acoustic Wave resonator Filter" by reference, all commonly owned with the instant application.

FIELD OF THE INVENTION

The present invention relates to a bandpass filter using a leaky surface acoustic wave (LSAW) resonator employing a plurality of longitudinally coupled LSAW resonators which are connected in series, and more particularly, to a longitudinally coupled LSAW resonator with improved performance due to thicker or denser metalization than previously feasible.

BACKGROUND OF THE INVENTION

As the telecommunications industry and society continue to push for mobile communications devices which are smaller, lighter, less expensive, and more energy efficient, the requirements for bandpass filters within these devices become increasingly stringent. Where once transversely coupled surface acoustic wave (SAW) resonator filters were widely used, high-performance transversal SAW filters or longitudinally coupled SAW or LSAW filters have begun to take their place. Transversal SAW filters have the advantages of high flexibility, wide bandwidth, and flat group delay time. However, with newer digital mobile communications protocols requiring smaller size and even less insertion loss, transversal filters simply cannot meet the requirements.

Longitudinally coupled SAW and LSAW resonator filters have become the technology of choice to meet these requirements because of their wide achievable bandwidth and low insertion loss. LSAW modes are typically employed on piezoelectric materials such as lithium niobate ($LiNbO_3$) and lithium tantalate ($LiTaO_3$) primarily for their high propagation velocity and piezoelectric coupling, as compared to conventional SAW (Rayleigh) modes.

Conventional longitudinally coupled LSAW resonator fitters as described in U.S. Pat. No. 5,485,052 typically consist of a plurality of LSAW resonator filter tracks connected in series. Each track consists of a pair of reflective gratings, between which are disposed a plurality of interdigital transducers (IDTs). In each track, one or more non-adjacent IDTs are connected together electrically so as to form a signal input for the track, and the remainder of the IDTs are electrically connected so as to form an output. Adjacent tracks are connected together in series such that the output of the first track is connected to the input of the second, whose output is connected to the input of the third, etc. The input of the first track and the output of the last track comprise the electrical input and output of the bandpass filter. The most common configurations employ only two tracks with two, three, or five IDTs in each track. FIG. 2a shows a schematic representation of a two-track longitudinally coupled LSAW resonator filter of the prior art with three IDTs per track, and FIG. 2b shows one with five IDTs per track.

Good bandpass characteristics can be achieved with longitudinally coupled LSAW resonator filters by introducing resonant cavities between adjacent IDTs and between the gratings and the IDTs adjacent to them. Typically in the art, the resonant cavities are nothing more than spacers inserted between each IDT and its neighboring IDT or grating. The length of these spacers can be either positive (i.e. moving the IDTs/gratings further apart) or negative (i.e. moving the IDTs/gratings closer together). Spacers between adjacent IDTs are typically on the order of $\pm\lambda/4$, where $\lambda$ is the acoustic wavelength, and the spacers between the gratings and the adjacent IDTs are usually much smaller (e.g. $\pm\lambda/40$).

Factors limiting the ultimate performance of longitudinally coupled LSAW resonator filters include, among others, the piezoelectric coupling coefficient of the substrate, the acoustic energy lost due to reflective scattering into the bulk of the substrate, and the power density at all points within the device. The present invention improves upon all three of these factors, thereby allowing the realization of a longitudinally coupled LSAW resonator filter with improved bandwidth, insertion loss, return loss, and power handling capability over the prior art.

SUMMARY OF THE INVENTION

The reflectivity, $\kappa$, and piezoelectric coupling coefficient, $K^2$, for LSAW modes on most commonly used piezoelectric substrates increase over some range of increasing metal thickness or density. By way of example, FIG. 3a shows the piezoelectric coupling coefficient for an LSAW on 42° Y-rotated $LiTaO_3$ as a function of aluminum metalization thickness, h, normalized to the acoustic wavelength, 1, for a metalization duty factor (line:space ratio) of 55%. The coupling coefficient is at a maximum with a metalization thickness ratio of about 10%. FIG. 3b shows the relationship between metal thickness, h, and reflectivity, $\kappa$. Here it can be seen that $\kappa$ increases strongly with thickness over the entire range. Both of these phenomena would suggest that optimal performance of a longitudinally coupled LSAW resonator filter on 42° Y-rotated $LiTaO_3$ would be achieved at a metal thickness of 10% or higher. However, another factor, insertion loss due to bulk scattering, comes into play with conventional longitudinally coupled LSAW resonator filters.

The velocity of the LSAW mode is in very close proximity to the slow shear bulk acoustic wave (BAW) mode. Whenever a discontinuity is encountered by the propagating LSAW, energy is reflected backwards and, due to the close proximity of the BAW, a significant portion of that energy can be converted into BAW energy and lost into the bulk of the substrate. As reflectivity goes up, BAW radiation losses at the discontinuities go up as well. Thus, with conventional longitudinally coupled LSAW resonator filters, metal thicknesses have been limited to about 8.5% or less. As thickness is increased above 8.5%, losses due to BAW radiation outgrow the gains from increasing piezoelectric coupling and reflectivity.

Significant discontinuities encountered by the propagating wave on a conventional longitudinally coupled LSAW resonator filter are the phase discontinuities at the resonant cavities. These spacers are the primary source of bulk radiation loss and are what limit the metal thickness to 8.5%.

In the present invention, the phase discontinuities at the resonant cavities are eliminated by smoothly assimilating the spacers into the first wavelength or more of the adjacent IDTs, as shown in FIG. 4. This process is called "chirping" and is performed such that the fingers of the chirped wavelength(s) are regularly spaced across the gap between IDTs and/or gratings, but at a different spacial frequency than the remaining fingers of the IDT. The spacing is chosen such that the overall length of the chirped section is substantially equal to the analogous section of a conventional resonator filter, including the spacer-type resonant cavity. The application of chirping to coupled resonator filters is described in Deutsches Patentamt DE 4212517C2 as a possible way to improve bandwidth. However, the present invention takes a significant step forward over that teaching by utilizing this configuration's advantage of low BAW scattering in order to allow increased metal thickness so as to increase κ and $K^2$. Along with the decreased bulk scattering, the combination of increased reflectivity and piezoelectric coupling can result in longitudinally coupled LSAW resonator filters with lower insertion loss, lower return loss, and higher bandwidth.

Another advantage of the present invention is its power handling capability. In any acoustic wave resonator filter, the majority of the acoustic energy is confined within the resonant cavity (or cavities). In a conventional longitudinally coupled LSAW resonator filter where the resonant cavity is a very small (or even negative) space, the acoustic energy density is very high within the cavity, as shown in FIG. 5a. This limits the overall power handling capability of the device. In the present invention, however, the resonant cavity can be spread out over several wavelengths. This spreads the energy out over a wider area, as shown in FIG. 5b. Therefore, for a given total power the peak energy density within the resonant cavity is lower than that in the resonant cavity of a conventional longitudinally coupled LSAW resonator filter.

The present invention has still a further advantage over conventional longitudinally coupled LSAW resonator filters that use negative-length spacers.

In such a configuration, as shown in FIG. 4, the proximity of the adjacent fingers causes them to be shorted together. Therefore, both electrodes must be at the same potential, which means that no acousto-electric transduction can occur at this point. To make matters worse, this one point in the middle of the resonant cavity is where the majority of the acoustic energy is confined. Thus, at the spot where the energy density is highest, no transduction is taking place. This is a significant disadvantage. In the present invention, however, negative spacers can be incorporated into the transducers, and adjacent fingers do not touch. This allows adjacent transducers to be polarized such that the fingers centered within the resonant cavity are of opposite polarity, as shown in FIG. 1, and are, therefore, able to participate in the transduction of the acoustic wave.

By way of example, one embodiment of the present invention comprises first, second, and third IDTs disposed on a piezoelectric substrate and arranged in a surface wave propagating direction such that the second IDT is interposed between the first and the third IDTs, each of the first, second, and third IDTs having a plurality of electrode fingers. In this embodiment, the first and second IDTs have narrow electrode-finger pitch sections which have an electrode-finger pitch narrower than the remaining electrode-finger pitches, at respective end portions of the first and second IDTs, adjacent to each other. Likewise, the second and third IDTs have narrow electrode-finger pitch sections which have an electrode-finger pitch that is narrower than the remaining electrode-finger pitches, at respective end portions of the second and third IDTs, adjacent to each other. The electrode-finger pitch of the narrow electrode-finger pitch sections in the first and second IDTs are different from the electrode-finger pitch sections in the second and third IDTs. The respective narrow electrode-pitch sections also comprise different numbers of fingers with respect to each other.

BRIEF DESCRIPTION OF THE DRAWINGS

Preferred embodiments of the present invention are herein presented as well as others that will become more apparent by referring to the following detailed description and drawings in which.

DETAILED DESCRIPTION OF PREFERRED EMBODIMENTS

The present invention will now be described more fully with reference to the accompanying drawings in which preferred embodiments of the invention are shown and described. It is to be understood that the invention may be embodied in many different forms and should not be construed as limited to the illustrated embodiments set forth herein. Rather, the applicant provides these embodiments so that this disclosure will be thorough and complete, and will convey the scope of the invention to those skilled in the art.

Figure 1:
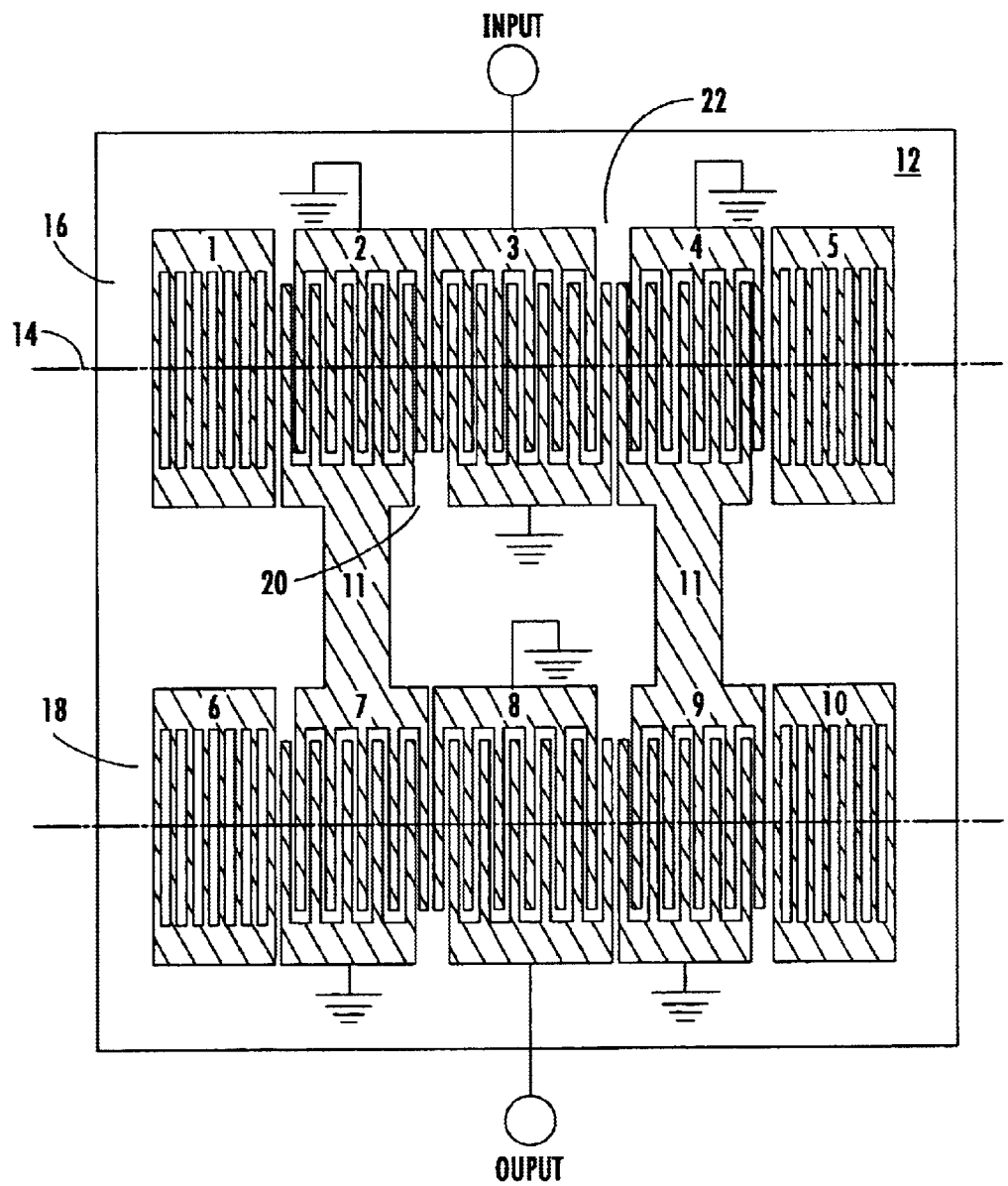
FIG. 1 is a schematic drawing of the longitudinally coupled LSAW resonator filter of the present invention.
Figure 2A:
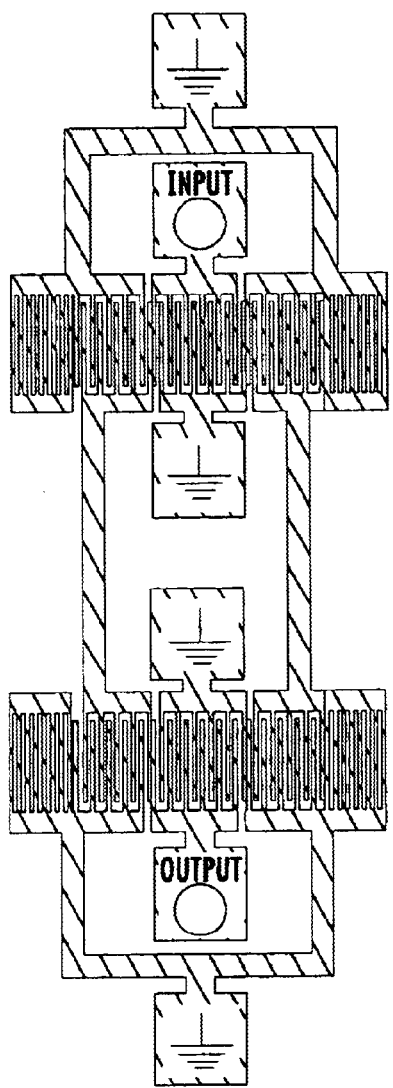
FIG. 2a and FIG. 2b are schematic representations of a typical 3-IDT longitudinally coupled LSAW resonator filter and 5-IDT longitudinally coupled LSAW resonator filter, respectively, of the prior art.
Figure 2B:
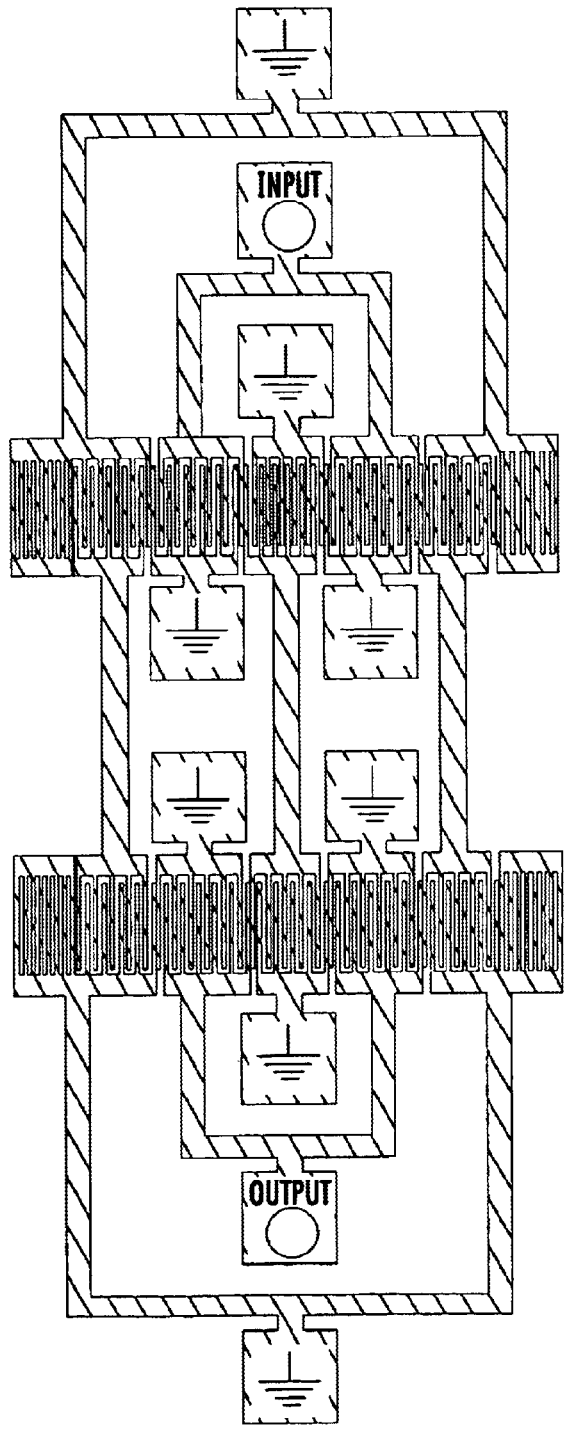
Figure 3A:
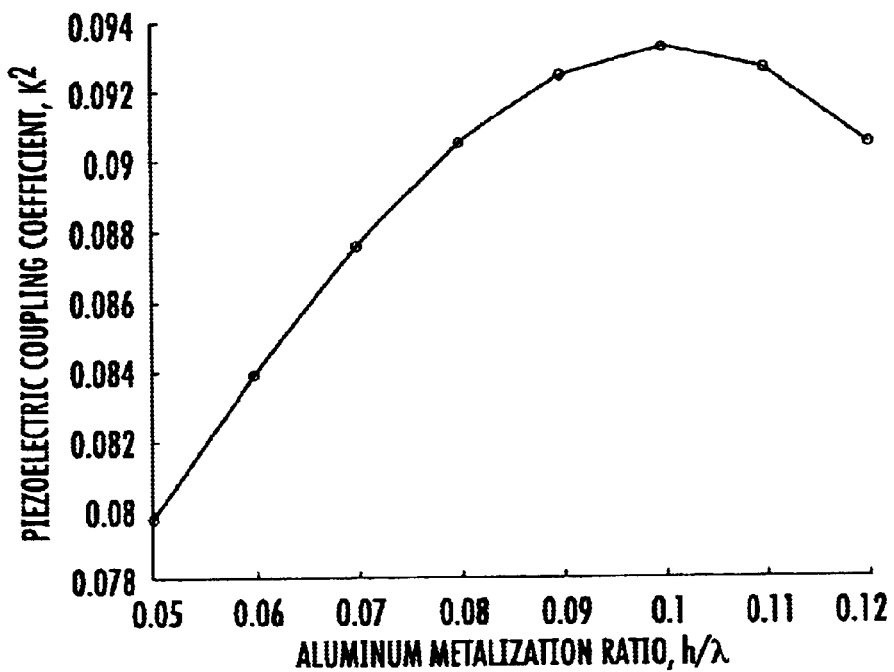
FIG. 3a and FIG. 3b illustrate a relationship between the piezoelectric coupling coefficient, $K^2$, and the reflectivity, κ, respectively, and the relative thickness of aluminum metalization for the IDTs and reflective gratings at a line:space ratio of 55:45.
Figure 3B:
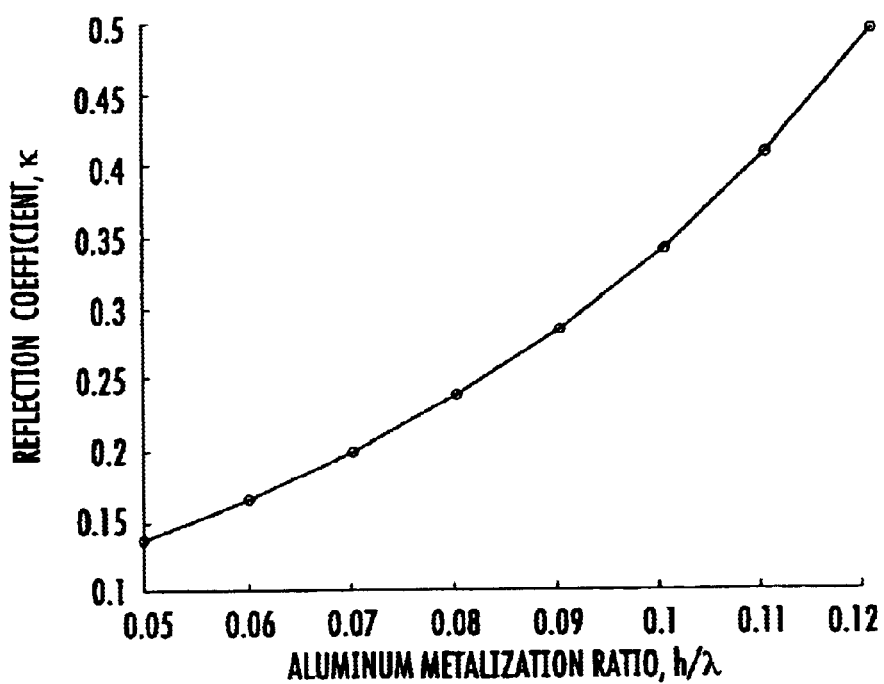

FIG. 1 is a schematic diagram of one preferred embodiment of the present invention. By way of example, a device of the present invention includes two separate LSAW resonator tracks 16, 18, connected in series. One first track 16. Track 1, includes an input IDT 3, two output IDTs 2 and 4, and two reflective gratings 1 and 5. The second track 18, Track 2, includes two input IDTs 7 and 9, an output IDT 8, and two reflective gratings 6 and 10. The output IDTs 2, 4 of the first track 16, Track 1, are connected in series to the input IDTs 7, 9 of the second track 18, Track 2, with metal strips 11. Such structure provides a plurality of IDTs 2, 3, 4 disposed upon a substrate 12 along a longitudinal axis 14 of surface acoustic wave propagation so as to form the longitudinally coupled leaky surface acoustic wave resonator filter track 16 having resonator cavities 20, 22 disposed between adjacent IDTs 2, 3, 4 within the track 16, the second track 18 being similarly herein described. The entire structure of the device is disposed upon a piezoelectric substrate 12 of $LiTaO_3$, whereby the crystallographic orientation is such that the LSAW propagation direction is parallel to the X-axis, and the normal to the surface is within the range of 32° to 52° rotated from the Y-axis. The IDTs, gratings, and metal strips are an aluminum material with a thickness within the range of 9% to 12% of the acoustic wavelength of the device. The ratio of the width of the fingers of the IDTs and gratings to the spaces between those fingers is within the range of 45:55 to 75:25.

Figure 4:
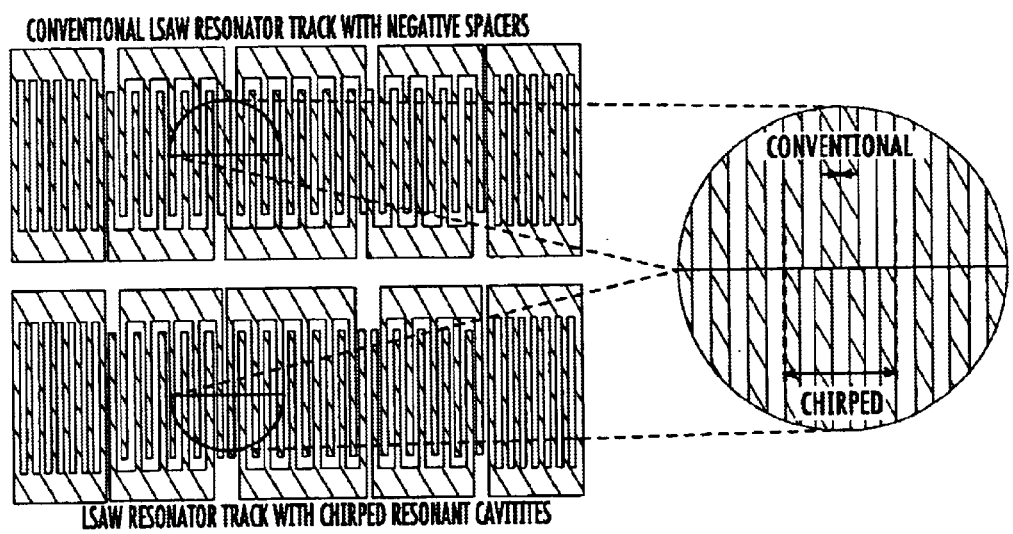
FIG. 4 illustrates the difference between a longitudinally coupled LSAW resonator filter with spacer-type resonant cavities of the prior art and a longitudinally coupled LSAW resonator filter with chirped resonant cavities of the present invention.
Figure 5A:
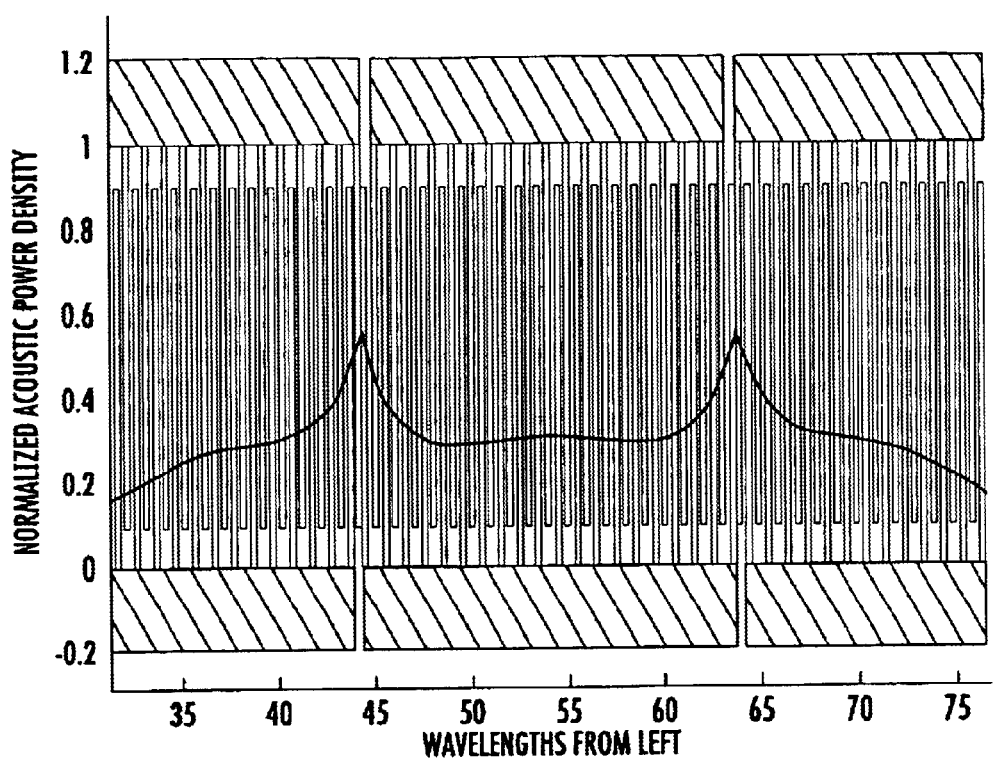
FIG. 5a and FIG. 5b plot the acoustic energy density as a function of position around the resonant cavities of conventional spacer-type cavities and the chirped cavities of the present invention, respectively.
Figure 5B:
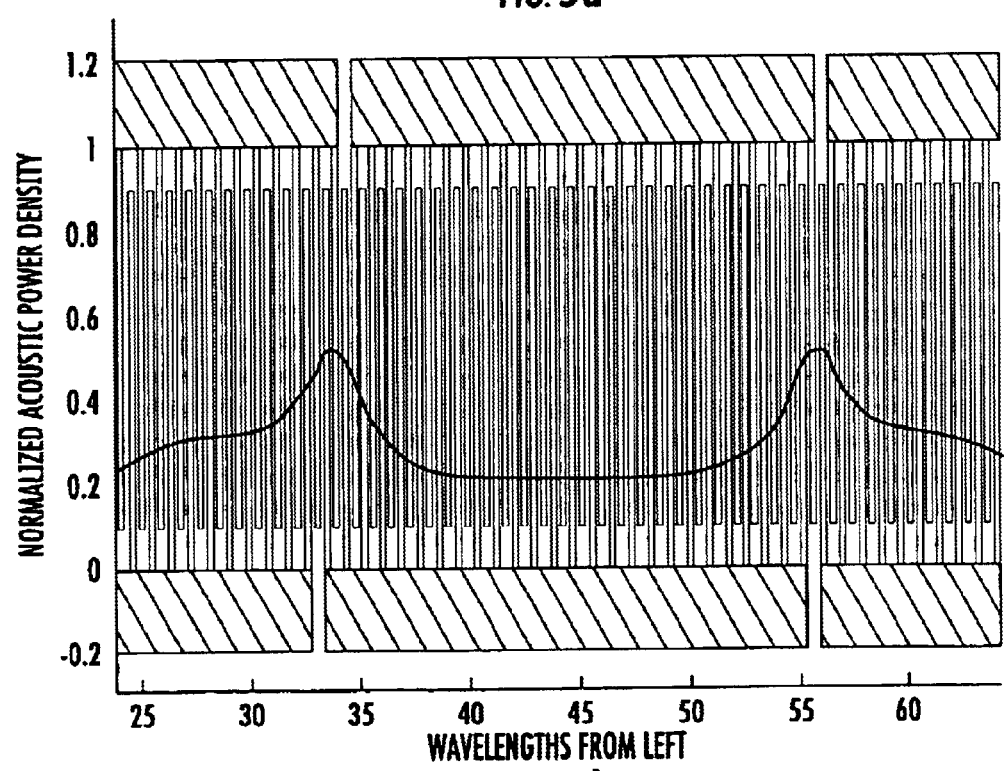

Between each IDT 2–4 and 7–9 and the adjacent IDTs or spacers 1–10, resonant cavities are formed by chirping the fingers of the IDTs in proximity to the cavity, preferably the outer wavelength of each IDT. This phenomenon is illustrated with reference again to FIG. 4 contrasting the conventional spacer-type resonant cavities of the prior art. It can be seen that the phase discontinuity formed by the spacer of the prior art is eliminated by chirping the resonant cavity of the present invention.

Figure 6:
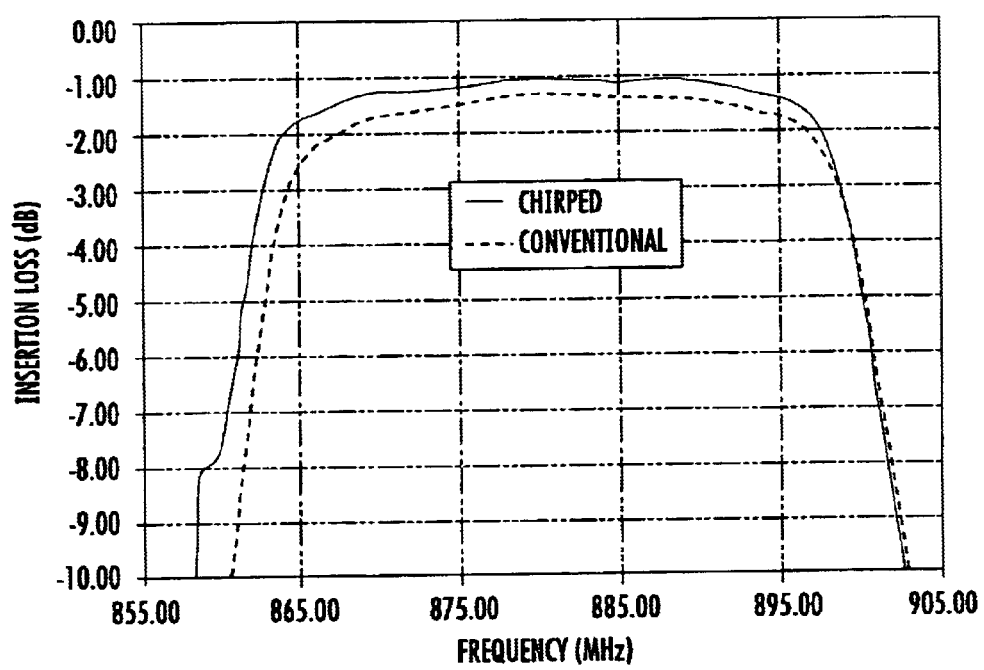
FIG. 6 shows a comparison between the transfer function of a conventional 2-track, 3-IDT longitudinally coupled LSAW resonator filter of the prior art and that of a similar longitudinally coupled LSAW resonator filter of the present invention.

In another preferred embodiment, the IDTs of one or more of the tracks are configured such that the input port, output port, or both ports can be operated in differential or balanced mode. As shown in FIG. 6, the longitudinally coupled LSAW resonator filter of the present invention demonstrates significant improvement over the prior art. The plots of FIG. 6 include the passband transfer function of two similar longitudinally coupled LSAW resonator filters, one designed using conventional techniques and the other designed using the techniques of the present invention. It can be seen that the technique of the present invention results in a passband with significantly wider bandwidth and lower insertion loss.

It is to be understood that although the characteristics and advantages of the present invention have been set forth in the foregoing description of the preferred embodiment, the disclosure is illustrative only, and changes may be made by those skilled in the art within the scope of the appended claims.

That which is claimed is:

1. A longitudinally coupled leaky surface acoustic wave resonator filter comprising:
    a piezoelectric substrate suitable for propagating a leaky surface acoustic wave;
    a plurality of interdigital transducers disposed upon the substrate in an acoustically cascading manner along a longitudinal axis of surface acoustic wave propagation so as to form a longitudinally coupled leaky surface acoustic wave resonator filter track having one or more resonant cavities disposed between adjacent interdigital transducers within the track, wherein a chirping of an electrode pitch of interdigital transducer electrodes in a vicinity of the one or more resonant cavities differs from an electrode pitch in a central portion of the interdigital transducers forming the one or more resonant cavities for reducing a phase discontinuity in the vicinity of the resonant cavity, thus reducing a bulk acoustic wave scattering loss; and
    a reflective element disposed at opposing ends of the longitudinally coupled resonator filter track.

2. A longitudinally coupled leaky surface acoustic wave filter according to claim 1, wherein the reflective elements are comprised of metallic gratings.

3. A longitudinally coupled leaky surface acoustic wave filter according to claim 1, wherein the electrode pitch in the vicinity of the resonant cavity is formed by altering the spatial frequency of the electrodes of one or both of the interdigital transducers or reflective elements within a range of ½ to 5 wavelengths of the interdigital transducers or the reflective elements.

4. A longitudinally coupled leaky surface acoustic wave resonator filter according to claim 1, wherein the piezoelectric substrate comprises one of lithium translate and lithium niobate.

5. A longitudinally coupled leaky surface acoustic wave resonator filter according to claim 1, wherein the piezoelectric substrate comprises lithium tantalate which has been cut such that a propagation direction of the leaky surface acoustic wave operable therewith is substantially parallel to the crystallographic X-axis, and the normal to the surface cooperating with the wave is within the range of 32° to 52° rotated from the crystallographic Y-axis.

6. A longitudinally coupled leaky surface acoustic wave resonator filter according to claim 1, wherein the interdigital transducers comprise at least one of aluminum, an alloy containing aluminum, and another conductive material of substantially similar density to aluminum.

7. A longitudinally coupled leaky surface acoustic wave resonator filter according to claim 6, wherein the thickness of the interdigital transducers is within the range of 9% to 12% of the nominal acoustic wavelength.

8. A longitudinally coupled leaky surface acoustic wave resonator filter according to claim 1, wherein the interdigital transducers are comprised of an electrically conductive material with a density substantially different than aluminum, wherein the thickness of the conductive material is chosen such that the magnitude of the acoustic reflection coefficient of a grating structure comprised of the conductive material at the thickness matches that of an identical grating structure comprised of aluminum with a thickness in the range of 9% to 12% of the nominal acoustic wavelength.

9. A longitudinally coupled leaky surface acoustic wave resonator filter according to claim 1, wherein the line:space ratio of the interdigital transducers is within the range of 45:55 to 75:25.

10. A longitudinally coupled leaky surface acoustic wave resonator filter according to claim 1, further comprising an electrical connection to at least one interdigital transducer forming an input port and an electrical connection to at least one other interdigital transducer forming and output port, wherein the plurality of interdigital transducers and longitudinally coupled resonator tracks are configured such that at least one of the input and output ports is comprised of two terminals of substantially opposite electrical phase, so as to allow the at least one of the input and output ports to be operated in differential or balanced mode.

11. A longitudinally coupled leaky surface acoustic wave resonator filter comprising:
    a piezoelectric substrate suitable for propagating a leaky surface acoustic wave; and
    a plurality of interdigital transducers disposed upon the substrate in an acoustically cascading manner along a longitudinal axis of surface acoustic wave propagation so as to form a longitudinally coupled leaky surface acoustic wave resonator filter track having one or more resonant cavities disposed between adjacent interdigital transducers within the track, wherein a chirping of an electrode pitch of interdigital transducer electrodes in a vicinity of the one or more resonant cavities differs from an electrode pitch in a central portion of the interdigital transducers forming the one or more resonant cavities for reducing a phase discontinuity in the vicinity of the resonant cavity, thus reducing a bulk acoustic wave scattering loss.

12. A longitudinally coupled leaky surface acoustic wave resonator filter according to claim 11, further comprising a reflective element disposed at opposing ends of the at least one longitudinally coupled resonator track.

13. A longitudinally coupled leaky surface acoustic wave filter according to claim 12, wherein the reflective element comprises a metallic grating.

14. A longitudinally coupled leaky surface acoustic wave filter according to claim 12, wherein the one or more resonant cavities is formed by altering the spatial frequency of the electrodes of the reflective element within a range of ½ to 5 wavelengths of the gap therebetween.

15. A longitudinally coupled leaky surface acoustic wave filter according to claim 11, wherein the one or more resonant cavities is formed by altering the spatial frequency of the electrodes of at least one of the plurality of interdigital transducers within a range of ½ to 5 wavelengths of the gap therebetween.

16. A longitudinally coupled leaky surface acoustic wave resonator filter according to claim 11, wherein the piezoelectric substrate comprises one of lithium tantalate and lithium niobate.

17. A longitudinally coupled leaky surface acoustic wave resonator filter according to claim 11, further comprising an electrical connection to at least one interdigital transducer forming an input port and an electrical connection to at least one other interdigital transducer forming and output port, wherein the plurality of interdigital transducers and longitudinally coupled resonator tracks are configured such that at least one of the input and output ports is comprised of two terminals of substantially opposite electrical phase, so as to allow the at least one of the input and output ports to be operated in differential or balanced mode.

18. A longitudinally coupled leaky surface acoustic wave resonator filter comprising:

a piezoelectric substrate suitable for propagating a leaky surface acoustic wave; and a plurality of interdigital transducers disposed upon the substrate in an acoustically cascading manner along a longitudinal axis of surface acoustic wave propagation so as to form a longitudinally coupled leaky surface acoustic wave resonator filter track having one or more resonant cavities disposed between adjacent interdigital transducers within the track, wherein a chirping of an electrode pitch of interdigital transducer electrodes in a vicinity of the one or more resonant cavities differs from an electrode pitch in a central portion of the interdigital transducers forming the one or more resonant cavities for reducing a phase discontinuity in the vicinity of the resonant cavity, thus reducing a bulk acoustic wave-scattering loss, and wherein the plurality of interdigital transducers is formed of metal having a thickness in a range of 9% to 12% of a normal acoustic wavelength of the resonator filter.

19. A longitudinally coupled leaky surface acoustic wave resonator filter according to claim 18, further comprising a reflective element disposed at opposing ends of at least one of the longitudinally coupled resonator tracks.

* * * * *